United States Patent
Scott et al.

(10) Patent No.: US 6,174,564 B1
(45) Date of Patent: *Jan. 16, 2001

(54) METHOD OF MAKING METAL POLYOXYALKYLATED PRECURSOR SOLUTIONS

(75) Inventors: Michael C. Scott; Carlos A. Paz de Araujo, both of Colorado Springs, CO (US)

(73) Assignee: Symetrix Corporation, Colorado Springs, CO (US)

( * ) Notice: Under 35 U.S.C. 154(b), the term of this patent shall be extended for 0 days.

This patent is subject to a terminal disclaimer.

(21) Appl. No.: 09/258,486

(22) Filed: Feb. 26, 1999

Related U.S. Application Data

(60) Division of application No. 08/291,366, filed on Aug. 16, 1994, now abandoned, which is a continuation-in-part of application No. 08/134,493, filed on Oct. 8, 1993, now abandoned, which is a continuation of application No. 07/807,439, filed on Dec. 13, 1991, now abandoned.

(51) Int. Cl.$^7$ ............................................ B05D 5/12
(52) U.S. Cl. ..................... 427/126.3; 427/226; 427/58
(58) Field of Search .................... 427/58, 126.3, 427/226

(56) References Cited

U.S. PATENT DOCUMENTS

| | | |
|---|---|---|
| 3,647,364 | 3/1972 | Mardiyanski et al. . |
| 4,507,245 | 3/1985 | Ozaki et al. . |
| 4,609,755 | 9/1986 | Farrar . |
| 4,847,239 | 7/1989 | Piotrowski et al. . |
| 4,880,770 | 11/1989 | Mir et al. . |
| 4,956,335 | 9/1990 | Agostinelli et al. . |
| 5,017,551 | 5/1991 | Agostinelli et al. . |
| 5,028,455 | 7/1991 | Miller et al. . |
| 5,034,550 | * 7/1991 | Sherif ........................................ 556/54 |
| 5,039,654 | 8/1991 | Mizuta et al. . |
| 5,071,833 | 12/1991 | Laine et al. . |
| 5,087,607 | 2/1992 | Strom et al. . |
| 5,094,882 | 3/1992 | Platts . |
| 5,122,510 | 6/1992 | Chen et al. . |
| 5,122,923 | 6/1992 | Matsubara et al. . |
| 5,204,313 | 4/1993 | Lelental et al. . |
| 5,304,533 | * 4/1994 | Kobayashi et al. ................... 505/440 |
| 5,601,869 | 2/1997 | Scott et al. . |

FOREIGN PATENT DOCUMENTS

| | | |
|---|---|---|
| 3828137 A1 | 3/1989 | (DE) . |
| 0125507 | 11/1984 | (EP) . |

OTHER PUBLICATIONS

Periodic Table, E.H. Sargent & Co., 1962.

Gessner G. Hawley, "The Condensed Chemical Dictionary," 9th ed., Van Nostrand Reinhold Company (New York), p. 134.

* cited by examiner

Primary Examiner—Brian K. Talbot
(74) Attorney, Agent, or Firm—Duft, Graziano & Forest, P.C.

(57) ABSTRACT

A liquid precursor solution for use according to a method of manufacturing metal oxide electronic components includes a polyoxyalkylated metal complex dispersed in an alkane solvent. The alkane solvent is preferably n-octane.

6 Claims, 7 Drawing Sheets

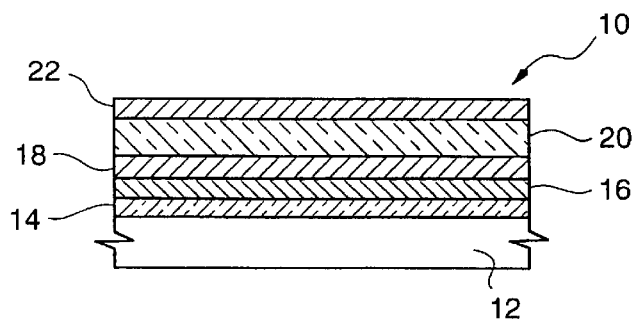
FIG. 1
FIG. 2
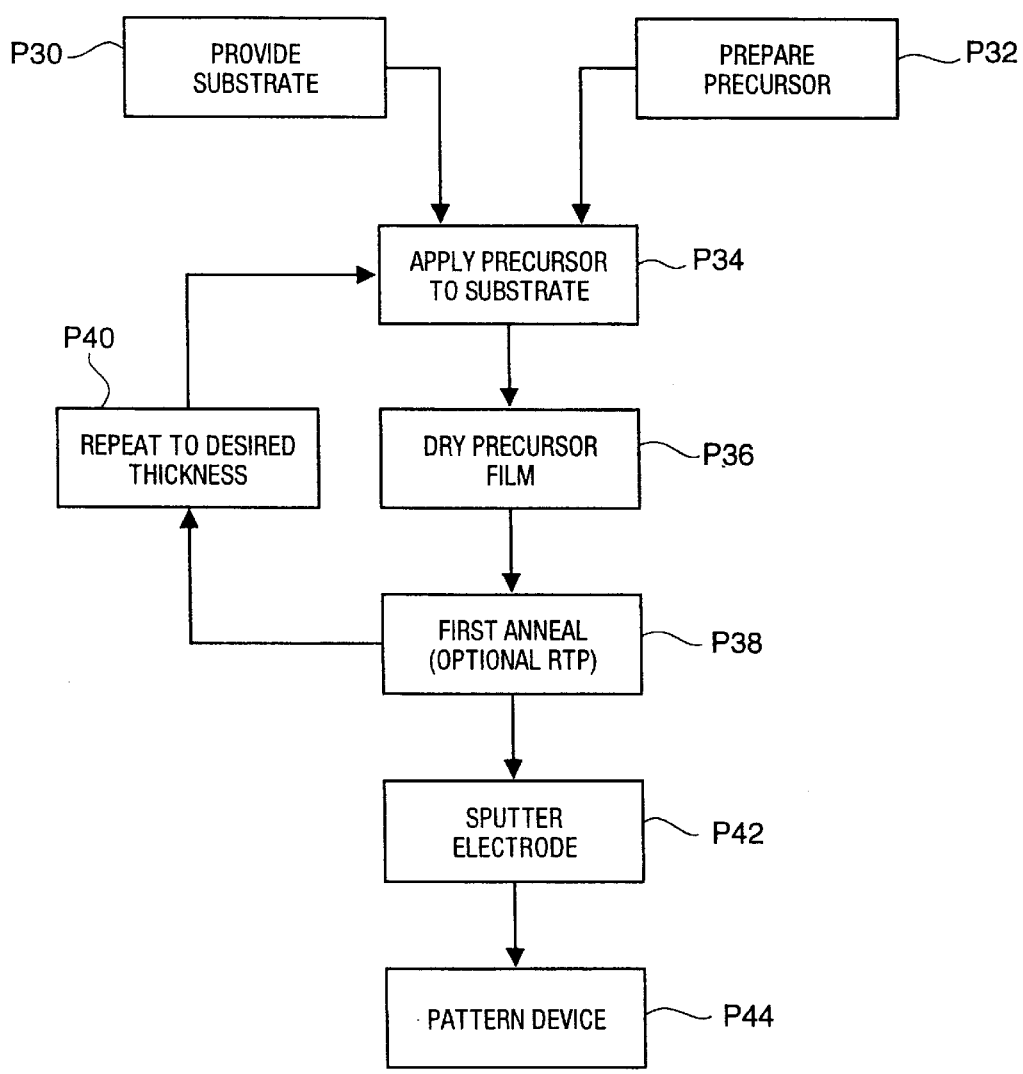

METHOD OF MAKING METAL POLYOXYALKYLATED PRECURSOR SOLUTIONS

RELATED APPLICATIONS

This application which is a divisional of application Ser. No. 08/291,366 filed Aug. 16, 1994 (now abandoned) is a continuation-in-part of U.S. patent application Ser. No.08/134,493 filed Oct. 8, 1993, now abandoned which is a continuation of U.S. patent application Ser. No. 07/807,439 filed Dec. 13, 1991 now abandoned.

BACKGROUND OF THE INVENTION

1. Field of the Invention

The present invention pertains to the field of liquid precursor solutions that may be used to produce solid metal oxide materials having specialized electrical properties. More specifically, the preferred precursor solutions include an octane solvent mixed with polyoxyalkylated metal complexes of a type that may be used in liquid deposition processes for manufacturing thin-film electrical components and, especially, ferroelectric or dielectric materials for use in integrated circuits.

2. Statement of the Problem

The use of hazardous chemicals in manufacturing processes has commensurate environmental and civil liability risks; however, these chemicals often continue to be used because no suitable replacement can be found. Even where replacement chemicals can be employed, manufacturers often choose to continue use of the old chemicals because of perceived quality and reliability problems in changing the manufacturing process. For example, the commercially available xylene solvents are typically a mixture of ortho, para, and meta xylene isomers. As of 1975, xylene was the 26th highest-volume produced chemical in the United States, and large xylene quantities are still produced by fractional distillation from petroleum. Nevertheless, human health-safety concerns have led government agencies to establish a safe threshold limit value for workplace exposure to xylene at about 100 ppm. Xylene, which typically has a flash point ranging from about 27.2 to 46.1° C. (values may vary depending upon the grade of xylene), also constitutes a dangerous fire hazard. Similar problems exist with the use of alcohols, ethers, esters and ketones, as well as with other aromatic hydrocarbons in addition to xylene.

Metal oxide films for use in integrated circuits have most frequently been formed by conventional sputtering techniques. See for example, Kuniaki Koyama, et al., "A Stacked Capacitor With $(Ba_xSr_{1-x})TiO_3$ For 256 M DRAM" in IDEM (International Electron Devices Meeting) Technical Digest, December 1991, pp. 32.1.1–32.1.4, and U.S. Pat. No. 5,122,923 issued to Shogo Matsubara et al. Other fabrication methods include pulsed laser deposition, and rapid quenching as listed in Joshi, P. C. et al., "Structural and Optical Properties of Ferroelectric Thin Films By Sol-gel Technique," Appl. Phys. Lett., Vol 59, No. 10, November 1991. These methods are relatively violent processes and, thus, inherently result in relatively poor control of the composition of the final thin film as a whole and variable composition throughout the film.

Metal oxide films have also been formed from sol-gels, i.e., a metal alkoxide which is hydrated to form a gel. These gels are applied to a semiconductor substrate to form a film, and then decomposed to form a metal oxide. One such method comprises the application of a sol-gel to a substrate followed by heat treatment. The heat decomposes the sol-gel and drives off the organics to form the metal oxide. See for example, U.S. Pat. No. 5,028,455 issued to William D. Miller et al., the Joshi article cited above, and B. M. Melnick, et al., "Process Optimization and Characterization of Device Worthy Sol-Gel Based PZT for Ferroelectric Memories", in Ferroelectrics, Vol 109, pp. 1–23 (1990). In another method, what has been termed a "MOD" solution is applied to a substrate followed by heating which decomposes the MOD solution and drives off the organics to form the metal oxide. See "Synthesis of Metallo-organic Compounds for MOD Powers and Films", G. M. Vest and S. Singaram, Materials Research Society Symposium Proceedings, Vol. 60, 1986 pp. 35–42 and "Metalorganic Deposition (MOD): A Nonvacuum, Spin-on, Liquid-Based, Thin Film Method", J. V. Mantese, A. L. Micheli, A. H. Hamdi, and R. W. Vest, in MRS Bulletin, October 1989, pp. 48–53. Generally the sol-gel method utilizes metal alkoxides as the initial precursors, while the MOD technique utilizes metal carboxylates as the initial precursors. These techniques require the addition of water to the solution prior to application of the solution to a substrate. The use of water induces undesirable chemical reactions, e.g., the possible precipitation of metalized reagents and severe viscosity changes.

The above references typically discuss precursor compounds having metals that bond with organic ligands. These ligands must be broken down and removed during the heating-decomposition process. The molecular geometry creates relatively large distances across which the metal and oxygen atoms must link to form metal oxides. These distances can often result in cracking or other imperfections in the film, and, accordingly, impose a severely burdensome manufacturing duty of exacting control over multiple parameters, such as film thickness, drying and annealing temperatures, the substrate used etc.

In other liquid deposition processes, such as the sol-gel process described in the Melnick reference, the metal-oxygen-metal bonds of the final metal oxide are present in some degree; however the precursor is highly unstable and, therefore, is unsuited for use except immediately after preparation in the laboratory. One sol-gel reference, the Miller patent referenced above, mentions one metal carboxylate, lead tetra-ethylhexanoate, as a possible precursor; however the reference fails to disclose how this substance may be used as a sol-gel, and, furthermore, rejects this precursor as being less desirable because the large organic group was thought to result in more defects in the final film.

Thin-film metal oxide electronic components, i.e., those having thicknesses of less than about ten microns, may often require ferroelectric or dielectric properties. The film should have a relatively uniform grain size, which results in better crystalline qualities such as films free of cracks and other defects. The film grain size should also be small compared to the thickness of the film; otherwise the roughness of the film can be comparable to the thickness and other dimensions of the device components, which can make it difficult or impossible to fabricate devices within performance tolerances and can result in short circuits or other electrical breakdowns. Further, it is important that the fabrication processes be performed relatively rapidly, since long processes are more expensive in terms of the use of facilities and personnel.

In integrated circuit construction, it is sometimes useful to employ materials that exhibit relatively strong ferroelectric and dielectric behavior. These materials may include perovskites, and especially $ABO_3$ perovskites, such as barium titanate, wherein A and B are respective A and B site metal cations. In addition to having ferroelectric properties, the perovskite-like layered superlattice materials discovered by G. A. Smolenskii, V. A. Isupov, and A. I. Agranovskaya (See Chapter 15 of the book, *Ferroelectrics and Related Materials,* ISSN 0275–9608, [V.3 of the series Ferroelectrics and Related Phenomena, 1984] edited by G. A. Smolenskii (especially sections 15.3–15), may also have high dielectric constants. On the other hand, these types of materials are not widely used on a commercial basis due to problems with polarization fatigue and retention of the ferroelectric polarization state. These problems are thought to result from uncompensated defects in the ferroelectric crystalline structure and associated ionic charge migrations.

Integrated circuits, which are sometimes called semiconductor devices, are generally mass produced by fabricating hundreds of identical circuit patterns on a single wafer. This wafer is subsequently sawed into hundreds of identical dies or chips. While integrated circuits are commonly referred to as "semiconductor devices" they are in fact fabricated from various materials which are either electrically conductive, electrically non-conductive, or electrically semiconductive.

The material out of which the wafer and other parts of integrated circuits are fabricated is generally either silicon (Si) or gallium arsenide (GaAs). Silicon is the most commonly used material, and the present invention will be described in terms of silicon technology. Nevertheless, the invention is also applicable to semiconductor technologies based on GaAs or even other semiconductors. Silicon can be used in either the single crystal or polycrystalline form in integrated circuits. In the integrated circuit fabrication art, polycrystalline silicon is usually called "polysilicon" or simply "poly", and will be referred to as such herein. Both forms of silicon may be made conductive by the addition of impurities, which are commonly referred to as "dopants." If the dopant is an element such as boron which has one less valence electron than silicon, electron "holes" become the dominant charge carrier and the doped silicon is referred to as p-type silicon. If the doping is with an element such as phosphorus which has one more valence electron than silicon, additional electrons become the dominant charge carriers and the doped silicon is referred to as n-type silicon.

Silicon dioxide is commonly used as an insulator or barrier layer in silicon-based semiconductors devices. Its use is so universal that in the integrated circuit art it is often referred to as simply as "oxide". Another common silicon-based structure is called polycide. This is a composite, layered material comprising a layer of metal silicide and a layer of polysilicon. CMOS (Complimentary Metal Oxide Semiconductor) technology is currently the most commonly used integrated circuit technology, and thus the present invention will be described in terms of silicon-based CMOS technology, although it is evident that the invention may be utilized in other integrated circuit technologies.

3. Solution to the problem:

The present invention overcomes the problems that are outlined above by providing an octane solvent for use in combination with essentially water-free polyoxyalkylated metal complexes that form liquid precursor solutions capable of yielding solid metal oxides suitable for use in integrated circuits and other electronic components incorporating thin-film metal oxides.

The related application Ser. No. 07/807,439 indicated that a xylene solvent is most preferred for use in liquid polyoxyalkylated metal precursor solutions, except where the respective polyoxyalkylated metal portions of these solutions include strongly polar molecules in liquid solution. It has been discovered that certain alkane solvents are capable of providing results on par with xylene solvents, thus, enabling avoidance of the deleterious effects of earlier solvents on human health and the environment. In particular, as compared to xylene, an octane solvent produces similar results in the manufacture of complex metal oxide electrical components, but octane is even more preferred for its relatively decreased levels of activity as an agent for causing environmental damage, its reduced incidence of health problems in exposed workers, and lessened safety risks such as potential for explosions or flash fires. The n-octane solvent is nearly ideal for liquid metal oxide deposition processes due to its high boiling point (125–127° C.) and apolar solvent properties that are similar to xylene.

Broadly speaking, the present invention includes methods and materials pertaining to the use of a precursor solution for forming complex metal oxides, wherein the oxide-forming fractions are dissolved in an alkane solvent. The solid complex metal oxides that are formed from these liquid precursors preferably have ferroelectric and/or dielectric properties that render the metal oxides useful in thin-film electronic devices such as integrated circuits. The alkane solvent preferably has from seven to ten carbons providing simple alkane or cycloalkane structures. For purposes of keeping these solutions essentially free of water by fractional distillation, the alkane solvent boiling point ("b.p.") should be greater than that of water; a straight-chain heptane (b.p.=98.4° C.) would not quite be suitable for use where distillation of water portions is required, whereas cycloheptane (b.p.=117° C.) would be suitable. Even so, straight-heptane would be suitable for distillation of solution liquids having a boiling point less than that of heptane. The alkane solvent is more preferably an octane, which is even more preferably essentially unsubstituted and unbranched, i.e., n-octane.

The metal oxide-forming portions of these solutions are preferably comprised of a metal polyoxyalkylated complex including a metal moiety bonded with an oxyorganic ligand selected from a group consisting of alkoxides, carboxylates, and mixtures thereof.

Prior related applications have recited that a xylene solvent works well in most precursor solutions. Where highly electropositive elements are present in the solutions, the solvent preferably includes 2-methoxyethanol, -butyl acetate and/or excess 2-ethylhexanoic acid. Some additional solvents that may be used, together with their boiling points, include: alcohols, such as 1-butanol (117° C.), 1-pentanol (117° C.), 2-pentanol (119° C.), 1-hexanol (157° C.), 2-hexanol (136° C.), 3-hexanol (135° C.), 2-ethyl-1-butanol (146° C.), 2-methoxyethanol (124° C.), 2-ethoxyethanol (135° C.), and 2-methyl-1-pentanol (148° C.); ketones, such as 2-hexanone (methyl butyl ketone) (127° C.), 4-methyl-2-pentanone (methyl isobutyl ketone) (118° C.), 3-heptanone (butyl ethyl ketone) (123° C.), and cyclohexanone (156° C.); esters, such as butyl acetate (127° C.), 2-methoxyethyl acetate (145° C.), and 2-ethoxyethyl acetate (156° C.); ethers, such as 2-methoxyethyl ether (162° C.) and 2-ethoxyethyl ether (190° C.); and aromatic hydrocarbons, such as xylenes (138° C.–143° C.), toluene (111° C.) and ethylbenzene (136° C.).

The precursor solutions may be used to form a ferroelectric or dielectric perovskite-like periodically repeating layered superlattice material, as described in copending application Ser. No. 07/965,190, which is hereby incorporated by reference herein. These layered superlattice materials comprise complex oxides of metals, such as strontium, calcium, barium, bismuth, cadmium, lead, titanium, tantalum, hafnium, tungsten, niobium zirconium, bismuth, scandium, yttrium, lanthanum, antimony, chromium, and thallium that spontaneously form layered superlattices, i.e. crystalline lattices that include alternating layers of distinctly different sublattices. Generally each layered superlattice material will include two or more of the above metals, and can be described in terms of a single average formula; for example, barium, bismuth and niobium form the layered superlattice material barium bismuth niobate, $BaBi_2Nb_2O_9$.

The layered superlattice materials may be summarized more generally under the formula:

(1) $A1_{w1}^{+a1} A2_{w2}^{+a2} \ldots Aj_{wj}^{+aj} S1_{x1}^{+s1} S2_{x2}^{+s2} \ldots Sk_{xk}^{+sk} B1_{y1}^{+b1} B2_{y2}^{+b2} \ldots Bl_{yl}^{+bl} Q_z^{-2}$, where A1, A2 . . . Aj represent A-site elements in the perovskite-like structure, which may be elements such as strontium, calcium, barium, bismuth, lead, and others S1, S2 . . . Sk represent super-lattice generator elements, which usually is bismuth, but can also be materials such as yttrium, scandium, lanthanum, antimony, chromium, thallium, and other elements with a valence of +3, B1, B2 . . . Bl represent B-site elements in the perovskite-like structure, which may be elements such as titanium, tantalum, hafnium, tungsten, niobium, zirconium, and other elements, and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

(2) $(a1w1+a2W2 \ldots +ajwj)+(s1x1+s2x2 \ldots +skxk)+(b1y1+b2y2 \ldots +bjyj)=2z$.

Formula (1) includes all three of the Smolenskii type compounds. The layered superlattice materials do not include every material that can be fit into the formula (1), but only those which spontaneously form themselves into crystalline structures with distinct alternating layers. It should be noted that the x, y, and z symbols in the formula (1) should not be confused with the x, y, and z, symbols used in the Formulae (3) and (4). The formula (1) is a general formula for layered superlattice materials, while the formulae (I) and (I') are formulae for solid solutions of particular layered superlattice materials.

It should also be understood that the term layered superlattice material herein also includes doped layered superlattice materials. That is, any of the material included in formula (1) may be doped with a variety of materials, such as silicon, germanium, uranium, zirconium, tin or hafnium. For example, strontium bismuth tantalate may be doped with a variety of elements as given by the formula:

(3) $(Sr_{1-x}M1_x)Bi_2(Nb_{1-y}M2_y)O_9 + \alpha\ M3O$, where M1 may be Ca, Ba, Mg, or Pb, M2 may be Ta, Bi, or Sb, with x and y being a number between 0 and 1 and preferably $0 \leq x \leq 0.2$, $0 \leq y \leq 0.2$, M3 may be Si, Ge, U, Zr, Sn, or Hf, and preferably $0 \leq \alpha \leq 0.05$. Materials included in this formula are also included in the term layered superlattice materials used herein.

Similarly, a relatively minor second component may be added to a layered superlattice material and the resulting material will still be within the invention. For example, a small amount of an oxygen octahedral material of the formula $ABO_3$ may be added to strontium bismuth tantalate as indicated by the formula:

(4) $(1-x)\ SrBi_2Ta_2O_9 + xABO_3$, where A may be Bi, Sr, Ca, Mg, Pb, Y, Ba, Sn, and Ln; B may be Ti, Zr, Hf, Mn, Ni, Fe, and Co; and x is a number between 0 and 1, preferably, $0 \leq x \leq 0.2$.

Likewise the layered superlattice material may be modified by both a minor $ABO_3$ component and a dopant. For example, a material according to the formula:

(5) $(1-x)\ SrBi_2Ta_2O_9 + XABO_3, +\alpha\ MeO$, where A may be Bi, Sb, Y and Ln; B may be Nb, Ta, and Bi; Me may be Si, Ge, U, Ti, Sn, and Zr; and x is a number between 0 and 1, preferably, $0 \leq x \leq 0.2$, is contemplated by the invention.

Alternatively, the precursor solutions may be used to form $ABO_3$ perovskites of the type described in copending application Ser. No. 08/132,744 filed Oct. 6, 1993, which is hereby incorporated by reference herein. The ferroelectric materials are preferably perovskites, and $ABO_3$ perovskites are particularly preferred. The $ABO_3$ perovskites are materials of the general form $ABO_3$ where A and B are cations and O is an oxygen anion component. The $ABO_3$ term also includes materials were A and B represent multiple elements, e.g., materials of the form $A'A''BO_3$, $AB'B''O_3$, and $A'A''B'B''O_3$, where A', A", B' and B" are different metal elements. The A, A', and A" metals are more preferably selected from the group of metals consisting of Ba, Bi, Sr, Pb, Ca, and La. The B, B', and B" metals are more preferably selected from the group consisting of Ti, Zr, Ta, Mo, W, and Nb. Many of these $ABO_3$ perovskites are ferroelectrics, though some that are classed as ferroelectrics may not exhibit ferroelectricity at room temperature. These ferroelectric materials typically have relatively high dielectric constants, and are useful in high dielectric constant capacitors, whether or not they are ferroelectric. Lead zirconate titanate, strontium titanate, and, especially, barium strontium titanate ("BST") are most preferred for use as the ferroelectric material.

The preferred process for preparing polyoxyalkylated metal precursors is provided in copending application Ser. No. 08/132,744 filed Oct. 6, 1993, now U.S. Pat. No. 5,514,822 which is hereby incorporated by reference herein. The process preferably includes reacting a metal, such as barium, strontium, or titanium, with an alcohol (e.g., 2-methoxyethanol) to form a metal alkoxide, and reacting the metal alkoxide with a carboxylic acid (e.g., 2-ethylhexanoic acid) to form a metal alkoxycarboxylate or metal alkoxide having a —O—M—O—M—O— group according to one of the generalized Formulae:

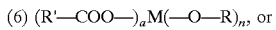

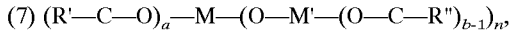

wherein M is a metal having an outer valence of (a+n) and M' is a metal having an outer valence of b, with M and M' preferably being independently selected from the group consisting of tantalum, calcium, bismuth, lead, yttrium, scandium, lanthanum, antimony, chromium, thallium, hafnium, tungsten, niobium, zirconium, manganese, iron, cobalt, nickel, magnesium, molybdenum, strontium, barium, titanium, and zinc; R' is an alkyl group having from 4 to 15 carbon atoms and R is an alkyl group having from 3 to 9 carbon atoms. Of course, even though the use of substances according to Formulae (6) and (7) are more preferred, mixtures of metal alkoxides, metal carboxylates, and metal alkoxycarboxylates in any proportion are acceptable for use in precursor solutions.

BRIEF DESCRIPTION OF THE DRAWINGS

FIG. 1 depicts a ferroelectric capacitor that is made with an octane precursor solution of the present invention;

FIG. 2 depicts a process schematic diagram for making a ferroelectric capacitor of the type depicted in FIG. 1;

DETAILED DESCRIPTION OF THE PREFERRED EMBODIMENT

Figure 3:
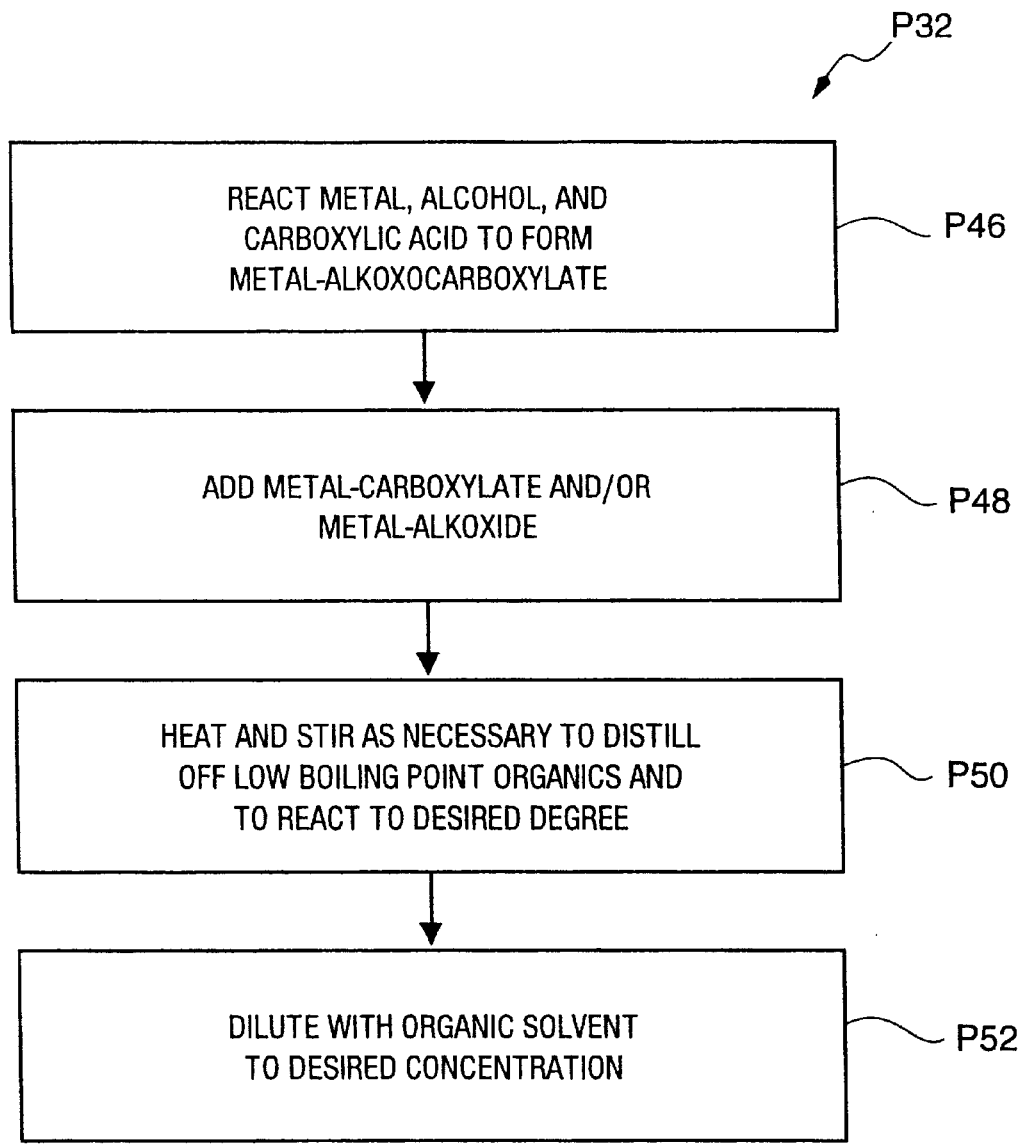
FIG. 3 depicts a process schematic diagram for the production of liquid polyoxyalkylated metal complex precursor solutions according to the present invention.

FIG. 1 depicts ferroelectric capacitor 10, which forms a thin-film electrical component according to the present invention. Capacitor 10 includes a silicon crystal substrate 12 having silicon dioxide barrier layer 14 formed thereon by thermal oxidation according to conventional techniques. Titanium adhesion layer 16 is sputtered atop barrier layer 14, and first platinum electrode 18 is formed over layer 16. It should be understood that adhesion layer 16, while preferred, is optional in that it is not required for a functional device. Ferroelectric material 20 is preferably an $ABO_3$ perovskite or a perovskite-like layered superlattice material having a thickness less than about ten microns. Ferroelectric material 20 is preferably polarizable at operational temperatures for capacitor 10. Even if ferroelectricity is not observed, most of these perovskites and perovskite-like materials also have high dielectric constants, e.g., dielectric constants greater than about 25, which permits them to function as traditional capacitors. Second platinum electrode 22 is sputtered atop ferroelectric material 20.

FIG. 2 depicts a process schematic diagram for use in manufacturing electrical components such as ferroelectric capacitor 10 of FIG. 1. The contents of the precursor solution should reflect relative molar proportions of polyoxyalkylated metals in amounts equivalent to the stoichiometric crystalline formula, after accounting for evaporation and sublimation losses in the manufacturing process.

Step P30 preferably includes providing a substrate including silicon layer 12, $SiO_2$ barrier layer 14, titanium adhesion layer 16, and first electrode 18. These components are not critical to the invention, and those skilled in the art will understand that step P30 more generally includes preparing any substrate to a point where ferroelectric material 20 may be applied. Layers 14 and 16, as well as electrode 18 are applied by conventional techniques such as thermal oxidation for the $SiO_2$ and sputtering for the metal layers. Step P30 most preferably also includes prebaking the metalized substrate including electrode 18 at a temperature that is greater than or equal to the temperature of any of the subsequent process steps to be performed on the substrate as described below. This optional portion of step P30 includes prebaking the substrate in an oxygen atmosphere, preferably in a diffusion furnace at a temperature of from about 500° C. to 1000° C. prior to the precursor application step P34. This prebaking step removes water and organic impurities from the substrate surface. More importantly, the prebaking decreases the internal stress of the platinum layer 18 through the annealing effect of the prebaking and the partial oxidation and interdiffusion of the adhesion layer 16 metal. This interaction between layers 14, 16 and 18 increases the adhesion between the barrier layer 14 and the ferroelectric film 20, in addition to minimizing a potential problem of the peeling of layers 16 and 18. Further, if the adhesion layer 14 is a transition metal, the partial oxidation stabilizes the metal chemically. Therefore, the number of mobile atoms penetrating into the ferroelectric layer 20 through the platinum layer 18 is decreased, and the ferroelectric layer 20 crystallizes more smoothly, i.e., without defects due to the diffused ions. If the substrate is not metallized, then the silicon or other wafer is preferably dehydrated at a lower temperature.

Step P32 includes preparing a liquid precursor solution that is capable of forming a solid metal oxide as ferroelectric material 20. Additional details pertaining to the manufacture of these precursor solutions, which are stoichiometrically balanced mixtures of polyoxyalkylated metals capable of forming complex metal oxides, are found in application serial number The precursor solution is preferably formed as a polyoxyalkylated metal complex, such as a metal alkoxycarboxylate, metal alkoxide, metal carboxylate, or mixture of these materials. The use polyoxyalkylated metal according to one of Formulae (6) and (7) is preferred due to the formation, in solution and prior to the annealing step, of at least 50% of the metal-to-oxygen bonds that will exist in the final metal oxide material, and the ability of liquid thin-films of these substances to decompose into solid metals oxides characterized by superior electrical performance. The precursor solution is preferably kept essentially water-free to avoid polymerization or the formation of excessively viscous gels by the interaction between water and the polyoxyalkylated metals. These precursor solutions work best for the preferred liquid deposition techniques when they are maintained in an essentially unpolymerized or unhydrated state. The liquid precursor solution includes various polyoxyalkylated metal portions in an alkane solvent. Though solubility problems are not usually observed, an apolar or weakly polar alkane solvent such as n-octane may optionally be mixed with an alkane-miscible polar solvent like n-butyl acetate as required for purposes of better solubilizing the polar polyoxyalkylated metals.

In step P34, the precursor of step P32 is applied to the substrate of step P30 by way of a liquid deposition process. It is preferred to apply the solution by spinning the substrate from about 1000 RPM to about 2000 RPM while flowing or dripping the precursor onto the substrate at room temperature for about 20 to 60 seconds using a standard spin-coater apparatus; however, these parameters may vary depending upon the precursor viscosity and the desired thickness of the film. This liquid deposition technique serves to coat a surface of the substrate with a uniform, liquid thin-film of precursor solution. It is also possible to utilize a misted deposition process, as described in application Ser. No. 07/992,380 filed Dec. 18, 1992, which is hereby incorporated by reference herein.

Step P36 includes drying the liquid precursor film that results from step P34. The liquid thin film of precursor solution is dried by baking it in air at a temperature from about 150° C. to about 500° C. for a period of time, e.g., 2 minutes to 30 minutes, which is sufficient to remove substantially all of the volatile organic components of the precursor compound; however, some carbon residue may be expected due to the calcining of remaining organic substituents during the baking and/or subsequent annealing process steps. The drying step may comprise a single drying step at a single temperature, or multiple step drying process at several different temperatures, such accompanied by a ramping up and down of temperature. The multiple step drying process is useful to prevent cracking and bubbling of the thin film which can occur due to excessive volume shrinkage corresponding to an excessively rapid temperature rise. An electric hot plate is preferably used to perform the drying step P36.

In the case of an $ABO_3$ material, such as BST, the drying of step P36 is preferably conducted at about 400° C. for from 2–5 minutes. In the case of a perovskite-like layered superlattice material, such as strontium bismuth tantalate, the drying occurs in two steps, one at from about 150° C. to about 170° C. for about 2 minutes and a second at about 260° C. to about 270° C. for about 4 minutes. The drying is done in air or in nitrogen, preferably, at low humidity of about 40% or less.

A first anneal is performed, in step P38, for purposes of forming crystalline grains in the dried layer of ferroelectric material 20 that results from step P36. This anneal is typically conducted at a temperature ranging from about 500° C. to about 1100° C. for a time that typically ranges from 30 minutes to 2 hours. The first anneal is preferably conducted in oxygen at from about 700° C. to about 850° C. for from about 1 hour to 2 hours. For BST, the annealing is more preferably at 750° C. to 800° C. for 80 minutes, while for strontium bismuth tantalate, the annealing is more preferably conducted at about 800° C. for about 70 minutes.

In some cases a rapid thermal processing ("RTP") anneal may precede the furnace anneal. For example, in the case of strontium bismuth tantalate, an RTP anneal at a 100° C./sec ramp rate and a maximum temperature of 725° C. for 30 seconds can be performed after the two drying stages of step P36. Radiation from a halogen lamp, infrared lamp, or an ultraviolet lamp provides the source of heat for the RTP bake step. The RTP bake is preferably performed in an oxygen atmosphere of between 20% and 100% oxygen, at a temperature between 500° C. and 850° C., with a ramping rate between 1° C./sec and 200° C./sec, and with a holding time of 5 seconds to 300 seconds. Substantially all of the residual organics are burned out and/or vaporized during the RTP process; however, a small quantity of residual carbon may be detected due to calcining of the bound organic fractions. At the same time, the rapid temperature rise of the RTP bake promotes nucleation, i.e., the generation of numerous small crystalline grains of layer 20. These grains act as nuclei upon which further crystallization can occur. The presence of oxygen in the bake process is essential in forming these grains.

Step P40 includes repeating steps P34, P36, and P38 as is necessary to obtain a desired thickness of ferroelectric or dielectric layer 20. The thickness of a single coat, via the spin process or otherwise, is very important to prevent cracking due to volume shrinkage during the subsequent heating steps. A single spin-coat layer should be less than about 2000 Å after the first anneal step P36. Therefore, multiple coating is necessary to achieve film thicknesses greater than about 2000 Å. The preferred film fabrication process includes RTP baking for each spin-on coat. That is, as shown in FIG. 2, the substrate 10 is coated, dried, and RTP baked, and these steps are repeated as often as necessary to achieve the desired thickness. Nevertheless, the RTP baking action of step P36 is not essential for every coating cycle. One RTP bake step for every two coats is practical, and even just one RTP bake step at the end of a series of coats is strongly effective in improving the electronic properties of most layered superlattice ferroelectrics. For a limited number of specific precursor/layered superlattice material compositions, particularly ones utilizing concentrations of bismuth in excess of stoichiometry, the RTP baking action of step P36 is not necessary.

Step P42 includes sputtering second electrode 22 (FIG. 1) by any conventional technique, such as DC magnetron sputtering or r.f. sputtering. Step P44 includes a conventional patterning of the device to form discrete circuit components as needed. More specifically, as will be understood by those skilled in the art, step P44 will preferably include the application of either a positive or negative photoresist, followed by ion-etching to pattern the device, and solvent mediated dissolution of the remaining resist. In the case of a negative photoresist, the resist is typically spun on at about 5000 rpm, soft baked on a hot plate for about 5 minutes at 90° C., subjected to a standard photo mask process with a 4 second UV exposure, a 1 minute development, 1 minute water rinse, and a 5 minute hard bake at 140° C. A positive resist may be spun on at 5000 rpm, soft baked on a hot plate at 95° C. for 2 minutes, followed by a standard photo mask process having a 7 second UV exposure, a 1 minute development, 1 minute water rinse, and a 5 minute hard bake.

FIG. 3 depicts step P32 in more detail. FIG. 3 depicts a flow chart of a generalized process according to the invention for forming a liquid precursor solution for fabricating thin films. The word "precursor" is often used ambiguously in this art. It may mean a solution containing one metal or a solution containing several metals which can be applied to a substrate. In this discussion we shall generally refer to the individual precursors as "initial precursors" and the precursor as applied to the substrate as the "final precursor" or just "precursor," unless the meaning is clear from the context. In intermediate stages the solution may be referred to as the "intermediate precursor".

In step P46 a first metal, indicated by the term M or M' in the equations below, is preferably reacted with an alcohol and a carboxylic acid to form a metal alkoxycarboxylate or a metal alkoxide having a —O—M—O—M—O— group according to formulae (6) or (7).

In a typical second step, P48, a metal carboxylate, a metal alkoxide or both may be mixed with the metal alkoxycarboxylate. Any of the metals listed above for formulae (6) or (7) may be reacted with any of the carboxylic acids listed above may form the metal carboxylate, while any of the metals listed above reacted with any of the alcohols may form the metal alkoxide.

In step P50 the mixture of polyoxyalkylated metals is heated and stirred as necessary to form metal-oxygen-metal bonds and boil off any low-boiling point organics that are produced by the reaction. Preferably, at least 50% of the metal to oxygen bonds of the final metal oxide are formed by the end of this step.

According to a generalized reaction theory, if a metal-alkoxide is added to the metal-alkoxycarboxylate, and the solution is heated, the following reactions occur:

(8) $(R-COO)_x-M-(O-C-R')_a + a\ M'-(O-C-R'')_b \rightarrow$
$(R-COO)_x-M-(O-M'-(O-C-R'')_{b-1})_a + a\ R'-C-O-C-R''$ (9) $(R-COO)_x-M-(O-C-R')_a + x\ M'-(O-C-R'')_b \rightarrow$
$(R'-C-O)_a-M-(O-M'-(O-C-R'')_{b-1})_x + x\ R-COO-C-R''$ where M and M' are metals; R and R'' are alkyl groups preferably having from zero to sixteen carbons; and a and b are integers denoting relative quantities of corresponding substituents. Generally the reaction of equation (8) will occur first since metal alkoxides react more readily than metal carboxylates. Thus, ethers having low boiling points are generally formed. These ethers boil out of the precursor, thus leaving a final precursor having a reduced organic content and the metal-oxygen-metal bonds of the final desired metal oxide already partially formed. If the heating is sufficient, some of the reaction (9) will also occur, creating metal-oxygen-metal bonds and esters. Esters generally have higher boiling points and remain in solution. These high boiling point organics slow down the drying process after the final precursor is applied to a substrate, which tends to reduce cracking and defects; thus, in either case, metal-oxygen-metal bonds are formed and the final precursor performance is improved.

If a metal-carboxylate is added to the metal-alkoxycarboxylate and the mixture is heated, the following reaction occurs:

(10) $(R-COO)_x-M-(O-C-R')_a + x\ M'-(OOC-R'')_b \rightarrow$
$(R'-C-O)_a-M-(O-M'-(OOC-R'')_{b-1})_x + x\ R-COOOC-R'$ where R—COOOC—R' is an acid anhydride, and the terms are as defined above. This reaction requires considerably more heat than do the reactions (8) and (9) above, and proceeds at a much slower rate.

In addition to the above reactions which produce metal-alkoxycarboxylates, reactions occur such as:

(11) $M(OR)_a + a\ HO_2C_8H_{15} + \text{heat} \rightarrow M(O_2C_8H_{15})_a + a\ HOR$, where the terms are as defined above. This reaction completely substitutes the alkoxide portion of the intermediate metal-alkoxycarboxylate to a full metal carboxylate; however, it is now believed that a complete substitution of the alkoxides by the carboxylates does not occur with the parameters as disclosed herein. Full substitution of the carboxylates requires significantly more heating, and even then may not readily occur.

In step P4, the solution is preferably diluted with an organic alkane solvent to produce a final precursor having the desired concentration. As part of the dilution step, a solvent exchange step may take place simultaneously or subsequently for purposes of changing the solvent portion of the precursor mixture. Compatible solvents that may be combined in the precursor mixture include: alkanes having from seven to ten carbons, xylenes, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1, 3, 5 trioxane, isobutyl isobutyrate, isobutyl propionate, propyl propionate, ethyl lactate, n-butanol, n-pentanol, 3-pentanol, toluene, ethylbenzene as well as many others. N-octane is a particularly preferred apolar solvent, and n-butyl acetate is a particularly preferred polar solvent.

The above exemplary reaction summary is generalized and, therefore, non-limiting. The specific reactions that occur depend on the metals, alcohols, and carboxylic acids used, as well as the amount of heat that is applied. It is noted that any combination of polyoxyalkylated metal complexes (as described above) may be used to practice the invention, but combinations of metal alkoxides, metal carboxylates, and metal alkoxycarboxylates are preferred, with solutions containing at least 5 mole % (based upon the total moles of solution) metal alkoxycarboxylates being particularly preferred due to the in-situ formation of metal to oxygen bonds in solution.

The following non-limiting examples set forth preferred materials and methods for practicing the present invention.

EXAMPLE 1

PREPARATION OF STRONTIUM BISMUTH TANTALATE PRECURSOR SOLUTION USING AN n-OCTANE SOLVENT

Various precursor solution ingredients were measured as set forth in Table 1 for use in preparing a precursor solution according to step P32 of FIGS. 2 and 3. These ingredients were used to make a liquid precursor solution capable of forming a perovskite-like layered superlattice material having an average formula of $Sr_{1.0}Bi_{2.2}Ta_{2.0}O_{9.3}$. The manufacturing procedure of this example was conducted at atmospheric pressure in a laboratory at Symetrix Corporation in Colorado Springs, Colo.

TABLE 1

PRECURSOR REAGENTS

| Compound | FW | g | mmole | Equiv. |
|---|---|---|---|---|
| Tantalum butoxide | 546.52 | 13.115 | 23.997 | 2.000 |
| 2-ethylhexanoic acid | 144.21 | 21.805 | 151.20 | 12.602 |
| Strontium | 87.62 | 1.0506 | 11.990 | 0.9993 |
| Bismuth 2-ethylhexanoate | 753.35 | 19.707 | 26.159 | 2.1802 |

In Table 1, "FW" indicates formula weight, "g" indicates grams, "mmoles") indicates millimoles, and "Equiv." indicates the equivalent number of moles in solution. Those skilled in the art will understand that several methods are available for acquiring or manufacturing these ingredients. In the present example, the ingredients were purchased on commercial order from several manufacturers. Specifically, tantalum butoxide was purchased from Uniprim of Tula, Russia, 2-ethylhexanoic acid was purchased from Aldrich Chemical Co. of St. Paul Minn., and strontium as well as bismuth 2-ethylhexanoate were purchased from Strem Chemicals, Inc. of Ward Hill, Mass.

The tantalum butoxide and 2-ethylhexanoic acid were combined in a flask with 15 ml of n-octane and stirred over a heater at a maximum temperature of less than 112° C. for about forty-eight hours. Thereafter, the strontium was added and reacted to completion before the flask was removed from the heat source. After removal from the heat source, an additional 40 ml quantity of n-octane was added and the flask was again heated to a maximum temperature of about 112° C. The bismuth 2-ethylhexanoate was then added to the flask, and the resultant mixture was diluted with n-octane to a final total volume of 60.0 ml for a 0.200 M precursor solution for the $Sr_{1.0}Bi_{2.2}Ta_{2.0}O_{9.3}$ material. This 0.200 M solution was diluted to 0.130 M by the addition of n-butyl acetate solvent in a 2.7 ml quantity.

It should be noted that the intended final product in a balanced perovskite-like layered superlattice material will have a formula of $Sr_{1.0}Bi_{2.0}Ta_{2.0}O_{9.0}$; however, ten percent excess bismuth has been added to the precursor solution. The addition of about nine to ten percent excess bismuth serves to compensate for the sublimation or volatilization of the bismuth moiety during conversion of the liquid precursor into a solid thin-film crystalline metal oxide material.

EXAMPLE 2

PREPARATION OF A STRONTIUM BISMUTH TANTALATE PRECURSOR SOLUTION USING A XYLENE SOLVENT

The ingredients of Table 1 were measured a second time. A second precursor solution was prepared in the same manner as was the precursor of Example 1, except xylene was substituted for n-octane as the primary solvent. After the addition of n-butyl acetate as a secondary solvent, this second precursor solution had a molarity of 0.130 moles per liter.

EXAMPLE 3

MANUFACTURING A FERROELECTRIC CAPACITOR FROM A POLYOXYALKYLATED METAL PRECURSOR SOLUTION

The precursor solution of Example 1 was used according to the method of FIG. 2 to make a ferroelectric capacitor of the type depicted in FIG. 1; however, top platinum electrode 22 was not sputtered into place, which permitted better access to ferroelectric layer 20 for electronic testing purposes.

A silicon wafer was thermally oxidized to provide $SiO_2$ barrier layer 14 atop silicon layer 12 according to conventional methods. Optional titanium adhesion layer 16 was not applied. First platinum electrode 18 was sputtered into place using a standard vacuum sputtering technique. Platinum electrode 18 was preannealed by baking the substrate (including electrode 18) in oxygen at 800° C. for thirty minutes. These actions completed step P30 of FIG. 2. Formation of the precursor in Example 1 completed step P32.

An eyedropper was used to apply about 1 ml of the precursor solution from Example 1 to the top of electrode 18. The liquid-coated substrate was spun at 1500 rpm for about 30 seconds on a standard spin-coater machine. The resultant liquid precursor film was dried in oxygen by baking on a hot plate at 160° C for about two minutes, then at 260° C. for about four minutes. These actions completed steps P34 and P36 of FIG. 2.

After drying, the substrate was subjected to a rapid thermal processing step for a first anneal. An AG Associates model 410 Heat Pulser utilizing a halogen heat source was used as the heat source to raise the substrate temperature to about 800° C. on a ten minute ramp of 75° C. per minute in an oxygen atmosphere. After holding the substrate at 800° C. for one hour, the substrate was returned to a room temperature environment by ramping down the temperature at an identical rate (75° C./min). Thereafter, the substrate was subjected to furnace baking in an oxygen atmosphere by using a mechanical arm to ramp the temperature up to 800° C. on an approximate 75° C./min ramp, holding the 800° C. temperature for 30 minutes, and returning the substrate to a room temperature environment on a 75° C./min ramp. These actions completed step P38 of FIG. 2. Step P40 included repeating steps P34, P36, and P38 for purposes of increasing the total thickness of layer 20 to about 1800 Å.

At this point, the substrate 10 had all of the layers in place as depicted in FIG. 2, except second platinum electrode 22 was absent and titanium adhesion layer 16 was absent. The absence of electrode 22 permitted several electronic tests to be conducted as described below. Alternatively, electrode 22 could have been sputtered into place in the manner of electrode 18 (step P42) and patterned according to a conventional photoetching process (step P44).

EXAMPLE 4

ELECTRICAL MEASUREMENTS OF FERROELECTRIC MATERIALS

Figure 4:
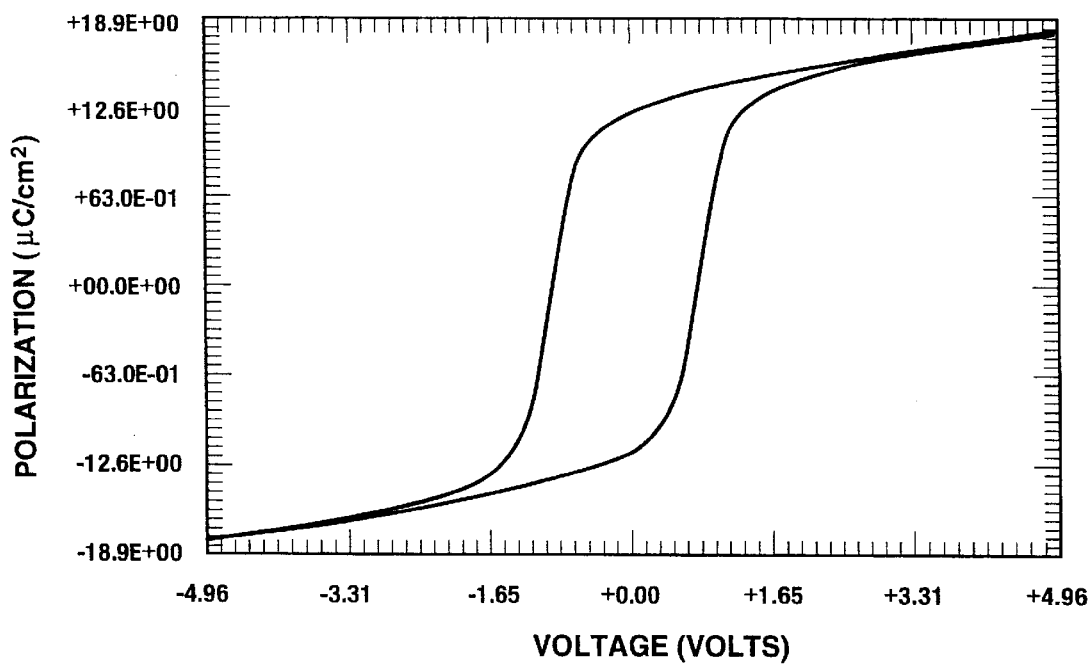
FIG. 4 depicts a polarization hysteresis curve for a first thin-film ferroelectric metal oxide material produced from a precursor solution having an n-octane and n- butyl acetate solvent according to the present invention, wherein bias voltage is plotted against polarization of the ferroelectric material.

FIG. 4 is a plot depicting a ferroelectric hysteresis curve for the strontium bismuth tantalate material of layer 20 that was produced in Example 3 from the octane-solubilized precursor solution. The ordinate represents polarization in $\mu C/cm^2$, while the abscissa represents the applied electric field in KV/cm. The data were obtained at the Symetrix Laboratories in Colorado Springs Colo. at atmospheric pressure and a room temperature of 293° K. The samples were tested using a HP 3314A function generator was operably connected with a HP 54502A digitizing oscilloscope and a load capacitance of $1.20 \times 10^{-8} F$. The strongly box-like quality of the hysteresis curve, which is elongated along the ordinate, is indicative of a good ferroelectric material.

Figure 5:
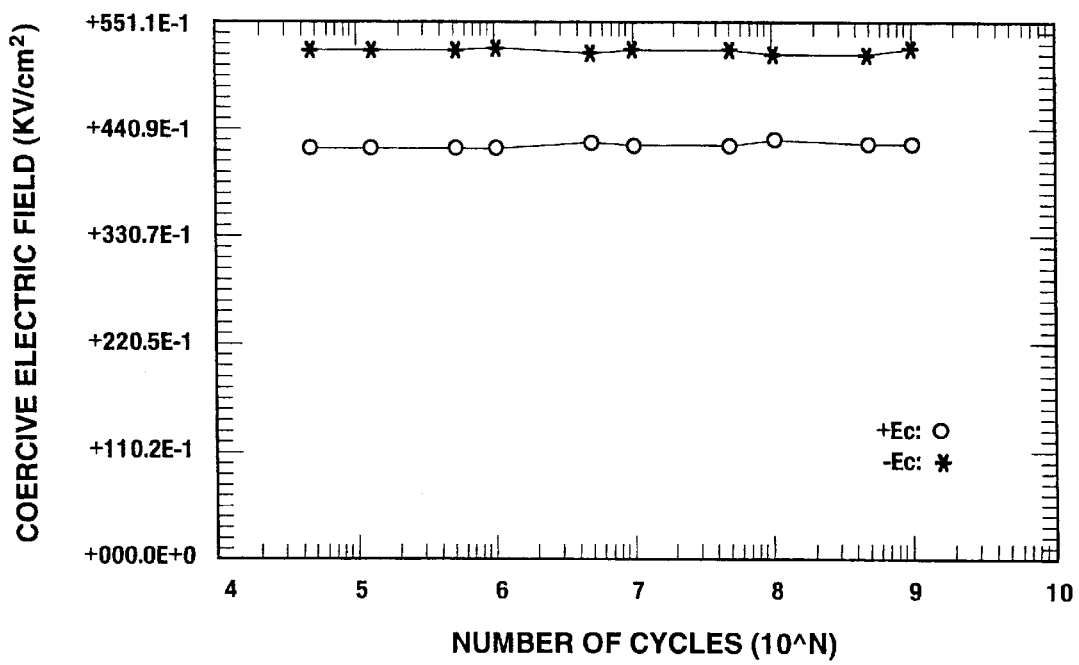
FIG. 5 depicts an endurance switching curve for the ferroelectric material of FIG. 4, wherein a logarithmic abscissa represents the number of switching cycles on and ordinate represents the coercive electric field.

FIG. 5 depicts a plot of switching cycles on a logarithmic abscissa versus coercive electric field ("Ec") on the ordinate. A Hewlit Packard 4275A LCR meter was used to conduct all of the ferroelectric switching measurements discussed below, again, at atmospheric pressure and a room temperature of 293° K. The data of FIG. 5 was obtained from the strontium bismuth tantalate material of layer 20 that was produced according to Example 3 using the octane-solubilized precursor solution. The results indicate that positive and negative Ec values remained essentially constant for up to $10^9$ switching cycles.

Figure 6:
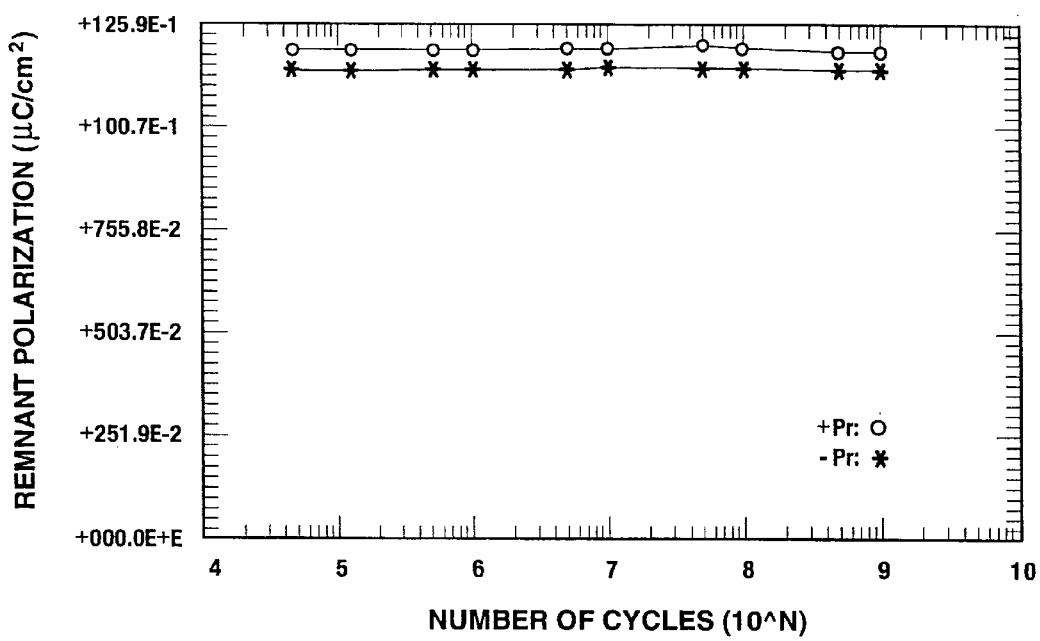
FIG. 6 depicts an endurance switching curve like that of FIG. 5, but wherein the ordinate represents remnant polarization.

FIG. 6 depicts a plot of switching cycles on a logarithmic abscissa versus remnant polarization (ordinate). Again, the data indicates that positive and negative Pr values remained essentially constant for up to $10^9$ switching cycles for a sample produced according to Example 3 from an octane-based precursor solution.

Figure 7:
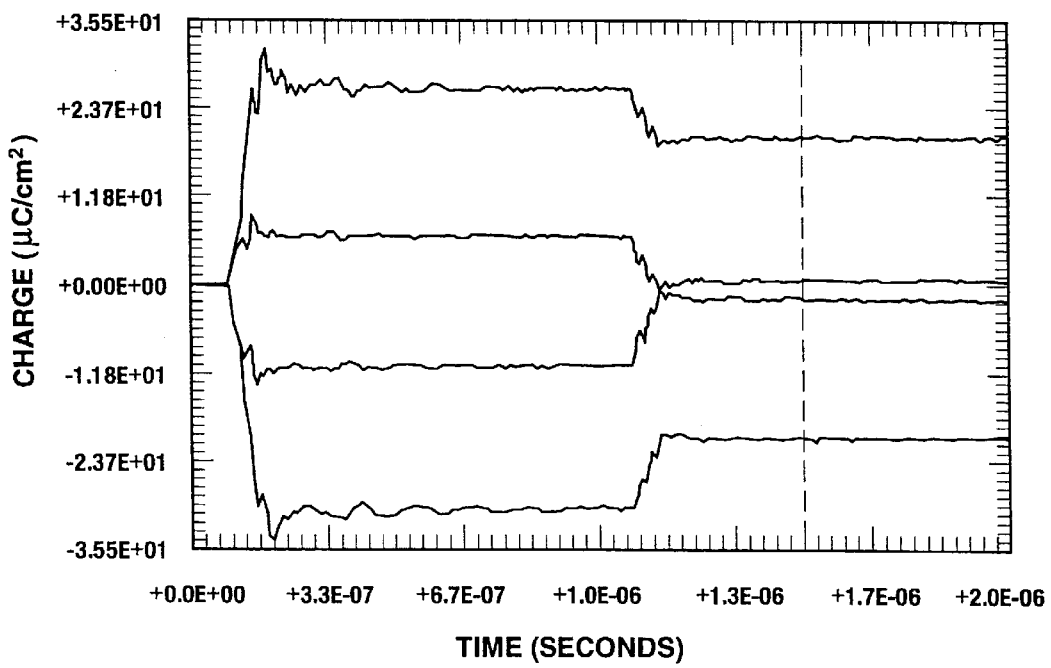
FIG. 7 depicts a PUND switching curve for the ferroelectric material of FIG. 7, wherein the abscissa represents switching time and the ordinate represents a charge (in $\mu C/cm^2$) across the material.

FIG. 6 depicts the results of PUND switching measurements that indicate the ferroelectric material 20, which was produced according to Example 3 from the octane-based precursor, is well suited for use in switching memory applications. The abscissa represents time in seconds, and the ordinate represents polarization in $\mu C/cm^2$. The term "PUND" derives its name from a well-known series of four voltage pulses; i.e., a positive pulse ("P"), a second positive up pulse ("U"), an negative pulse ("N"), and a second negative or down pulse ("D"). The sample is initialized by a negative pulse to assure that the material starts with a negative polarization and, thereafter, electrical parameters are measured for the respective PUND pulses. All of the pulses have the same absolute amplitude. The P pulse switches the material to a positive polarization. The U pulse determined the change between the residual polarization and the saturated polarization in the positive direction. Likewise, the N pulse measures the negative switching current, and the D pulse measures the change between the residual polarization and the saturated polarization in the negative direction. Generally, as is observed in FIG. 7, it is desirable for the P and N curves to be well separated from the U and D curves for delivery of a large signal in standard memory architectures. It is also desirable for the curves to fall quickly to a low value of current flow (i.e., about ten percent of the maximum rate), as an indicator of a fast switching material. The data of FIG. 5 also indicates this fast switching capability.

Figure 8:
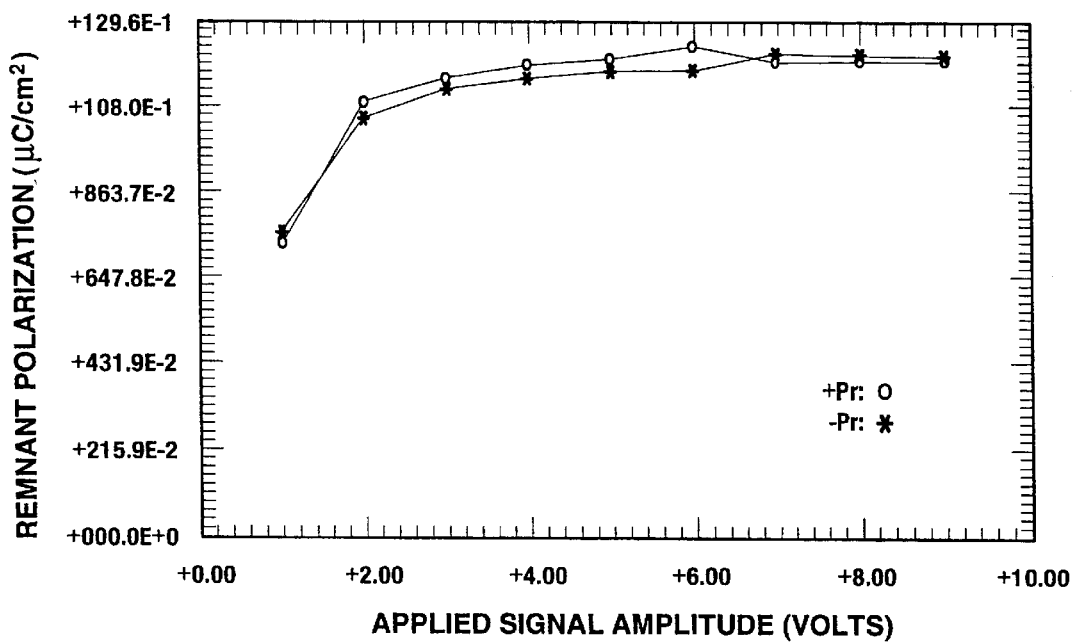
FIG. 8 depicts a plot of applied signal amplitude (abscissa) versus remnant polarization for the ferroelectric material of FIG. 4.

FIG. 8 depicts a plot of applied signal amplitude in volts (abscissa) versus positive and negative polarization values in $\mu C/cm^2$ (ordinate). This data was obtained from a sample produced according to Example 3 from an octane-based precursor solution. The data indicates that fully switched remnant polarization values were obtained for applied signals exceeding the range from about 4 to 6 volts.

EXAMPLE 5

COMPARATIVE RESULTS OF ELECTRICAL MEASUREMENTS

A second substrate 10 was manufactured in an identical manner with respect to the process of Example 3, except the xylene-based precursor solution of Example 2 was substituted for the n-octane-based precursor solution used in Example 3 (step P32). This second substrate was used for comparative purposes with respect to the first substrate, which was derived from the octane based solution of Example 1. A series of electronic measurements were conducted on this sample for purposes of comparing these results to the measurements of Example 3.

Figure 9:
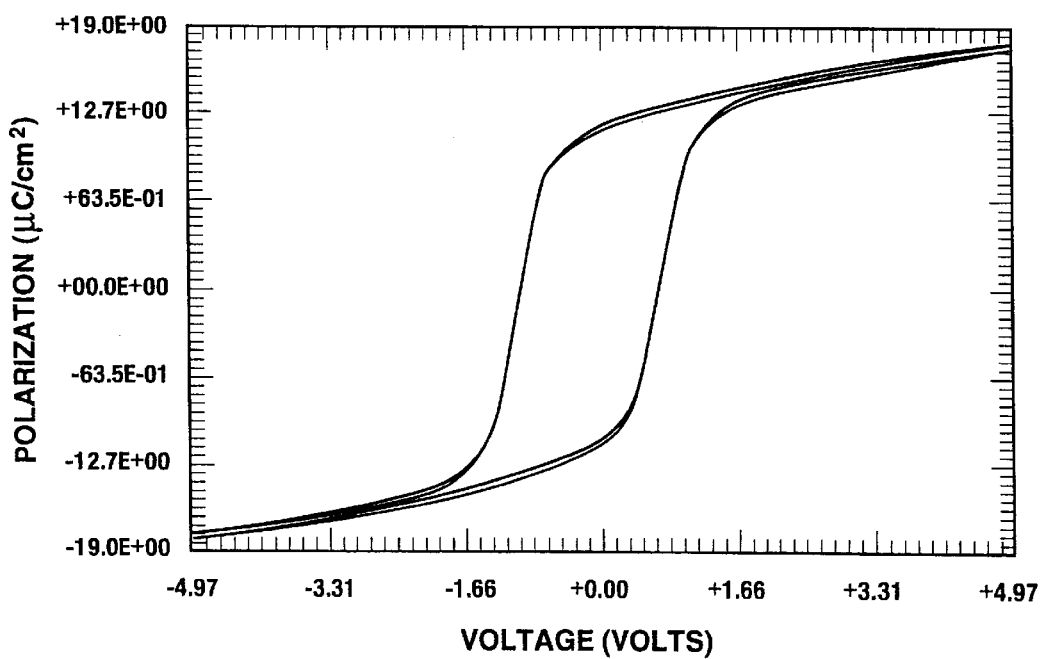
FIG. 9 depicts a ferroelectric hysteresis curve like that of FIG. 4, but including data obtained from a second ferroelectric metal oxide material produced from a precursor solution having an equal volume of xylene solvent substituted for the n-octane solvent of FIG. 4, wherein the data of FIG. 9 exhibits substantially the same electrical performance in comparison to the data of FIG. 4.
Figure 10:
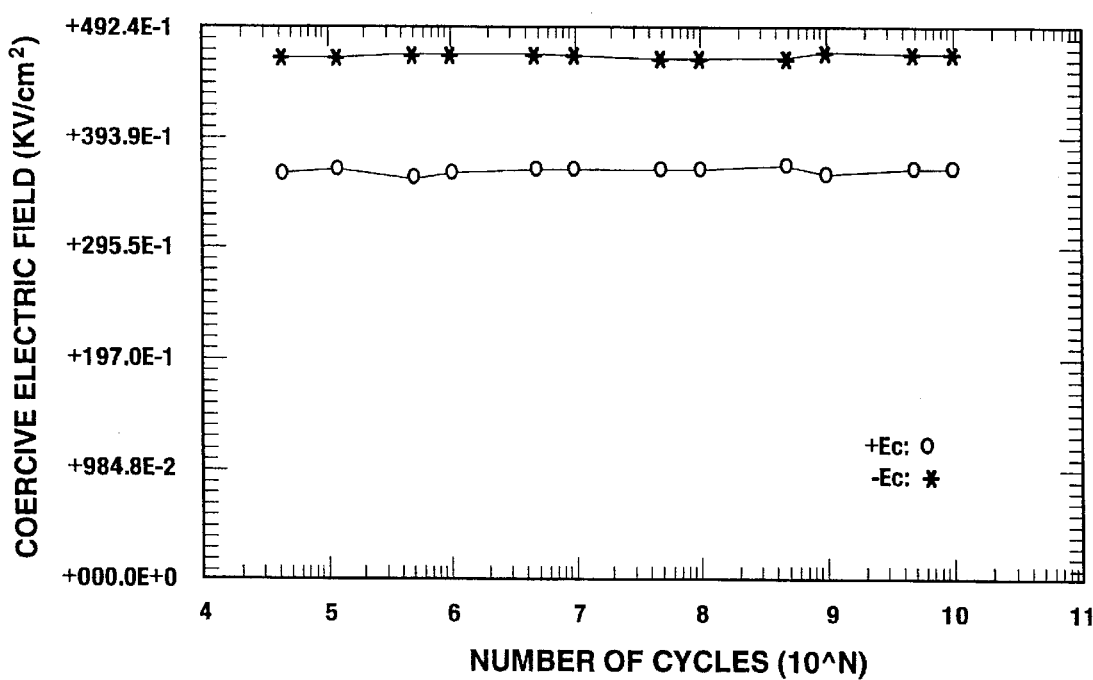
FIG. 10 depicts comparative switching endurance curves like those of FIG. 5, but including data obtained from the second ferroelectric material of FIG. 9.
Figure 11:
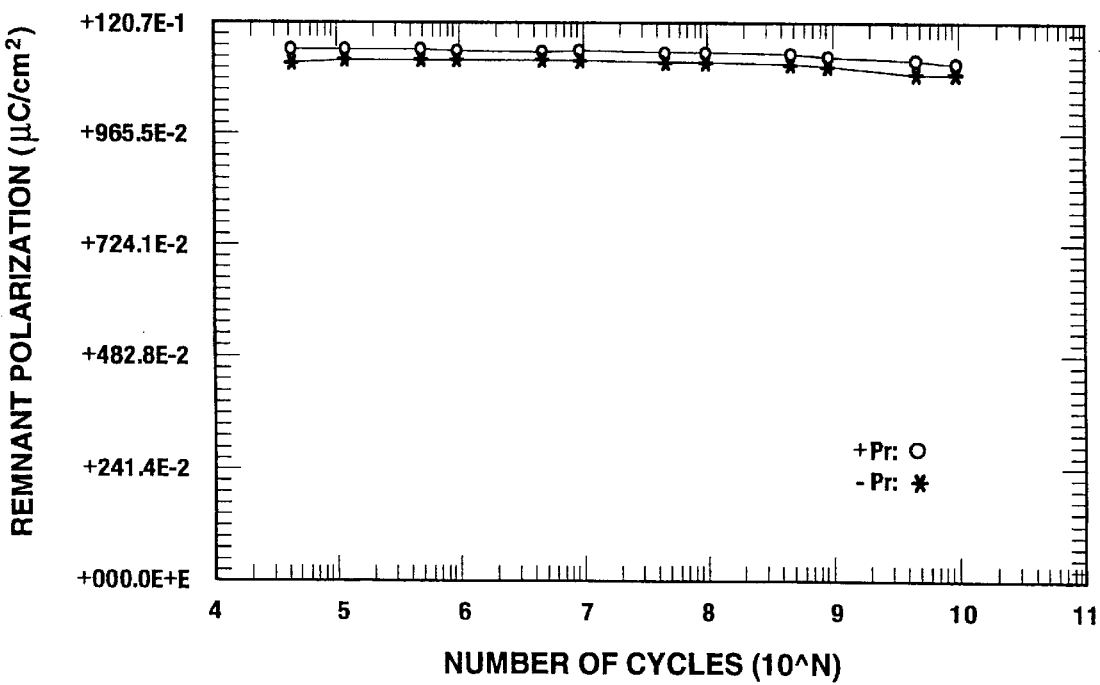
FIG. 11 depicts comparative switching endurance curves like those of FIG. 6 but including data obtained from the second ferroelectric material of FIG. 9.
Figure 12:
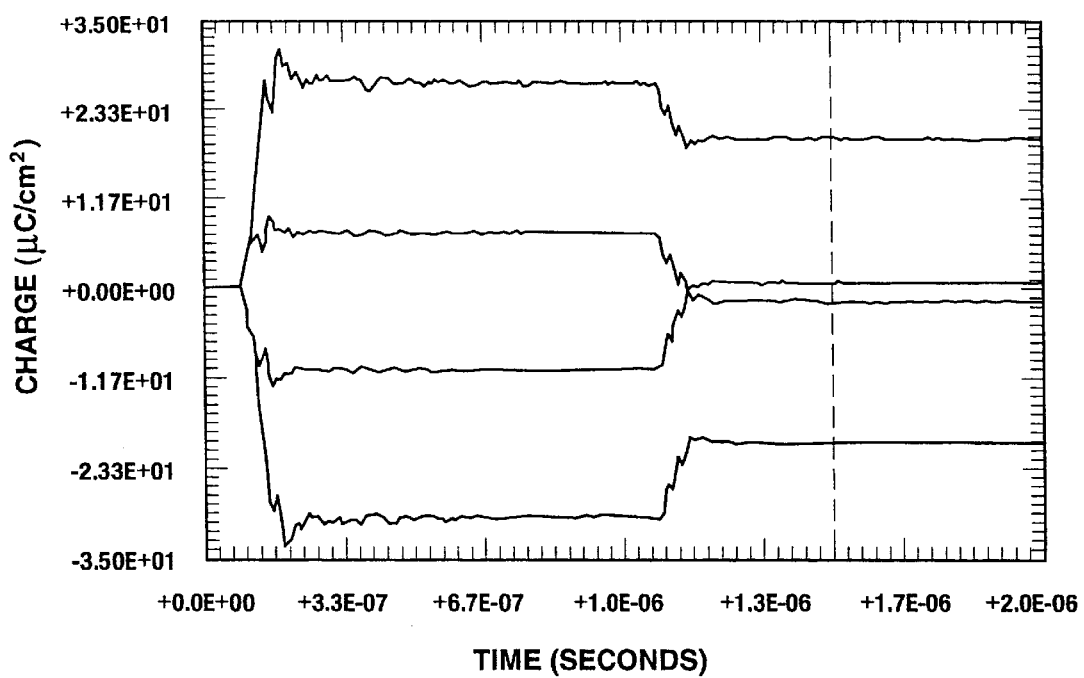
FIG. 12 depicts comparative PUND switching curves like those of FIG. 7 but including data obtained from the second ferroelectric material of FIG. 9.
Figure 13:
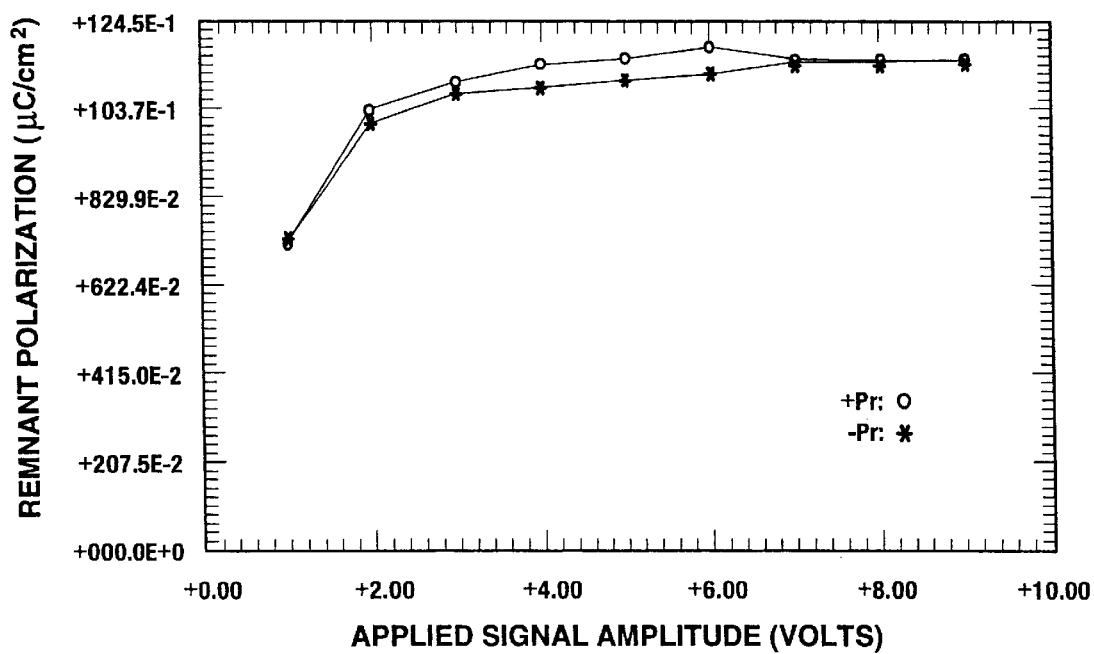
FIG. 13 depicts a comparative plot of applied signal amplitude versus remnant polarization of the same type as FIG. 8, but including data obtained from the second ferroelectric material of FIG. 9.

The electronic measurements that were conducted upon this second example produced results that were substantially identical to the results of Example 3. FIG. 9 depicts a hysteresis curve that is almost an exact overlay with respect to FIG. 4. FIG. 10 depicts coercive electric field endurance measurements that achieved substantially the same results as those depicted in FIG. 5. FIG. 11 depicts remnant polarization endurance measurements that are substantially identical in comparison to the results of FIG. 6. FIG. 12 depicts the results of PUND switching measurements that almost exactly overlay the results depicted in FIG. 7. FIG. 13 is a plot depicting remnant polarization versus applied signal amplitude results that are essentially indistinguishable from the results of FIG. 8.

These comparative results indicate that ferroelectric materials that are made from a first precursor solution formed of polyoxyalkylated metal complexes in an octane solvent have electrical properties that are essentially indistinguishable from those same types of ferroelectric materials made from a second precursor solution made of identical polyoxyalkylated metal complexes in a xylene solvent.

Those skilled in the art will understand that the preferred embodiments, as described hereinabove, may be subjected to various modifications without departing from the true scope and spirit of the invention. Accordingly, the inventors hereby state their intention to rely upon the Doctrine of Equivalents to protect their full rights in the invention.

We claim:

1. A method of producing a precursor solution capable of being used to form metal oxides, said method comprising the steps of:

providing an alkane solvent having a carbon number ranging from seven to ten;

forming a metal-organic complex having a formula including at least one O—M—O—M'—O group by mixing said alkane solvent with sufficient reagents to perform a reaction selected from the group consisting of:

(R—COO)$_x$—M—(O—C—R')$_a$+a M'—(O—C—R")$_b$→
(R—COO)$_x$—M—(O—M'—(O—C—R")$_{b-1}$)$_a$+a R'—C—O—C—R", and (R—COO)$_x$—M—(O—C—R')$_a$+x M'—(O—C—R")$_b$→
(R'—C—O)$_a$—M—(O—M'—(O—C—R")$_{b-1}$)$_x$+x R—COO—C—R", where M and M' are metals, R is an alkyl group having from three to nine carbon atoms, R' is an alkyl group having from four to fifteen carbon atoms, R" is an alkyl group having from zero to sixteen carbons, and a and b are integers denoting relative quantities of corresponding substituents; and heating said reagents in said solvent to perform said reaction whereupon said metal-organic complex has an effective concentration in said solvent for yielding a metal oxide thin film having a thickness less than ten microns of sufficient quality for use in integrated circuits upon annealing of said precursor solution.

2. The method as set forth in claim 1 wherein said forming step includes a step of reacting a metal alkoxide with a metal carboxylate to form a metal alkoxycarboxylate.

3. A method of producing a thin-film metal oxide electronic component from a liquid precursor solution, said method comprising the steps of:

reacting a metal moiety with an oxyorganic ligand to form an oxyorganic metal complex, said metal moiety and oxyorganic ligand being of appropriate kinds and amounts for forming said metal oxide;

combining said complex with an alkane solvent having a carbon number ranging from seven to ten, thereby forming a mixture;

coating a substrate with said mixture to form a thin-film of said mixture upon said substrate; and drying and annealing said thin film to form a solid film of said metal oxide having a thickness less than ten microns of sufficient quality for use in an integrated circuit.

4. The method as set forth in claim 3, wherein said reacting step includes forming a metal alkoxycarboxylate.

5. The method as set forth in claim 3 wherein said alkane solvent is n-octane.

6. The method as set forth in claim 3 wherein said step of reacting said metal moiety includes:

mixing said alkane solvent with sufficient reagents to perform a reaction selected from the group consisting of:

$$(R-COO)_x-M-(O-C-R')_a + a\, M'-(O-C-R'')_b \rightarrow$$
$$(R-COO)_x-M-(O-M'-(O-C-R'')_{b-1})_a + a\, R'-C-O-C-R'', \text{ and}$$

$$(R-COO)_x-M-(O-C-R')_a + x\, M'-(O-C-R'')_b \rightarrow$$
$$(R'-C-O)_a-M-(O-M'-(O-C-R')_{b-1})_x + x\, R-COO-C-R'',$$

where M and M' are metals, R is an alkyl group having from three to nine carbon atoms, R' is an alkyl group having from four to fifteen carbon atoms, R" is an alkyl group having from zero to sixteen carbons, and a and b are integers denoting relative quantities of corresponding substituents; and heating said reagents in said solvent to perform said reaction.

* * * * *